(12) United States Patent
Minh et al.

(10) Patent No.: US 12,032,398 B2
(45) Date of Patent: Jul. 9, 2024

(54) REGULATOR CIRCUIT AND METHODS THEREOF

(71) Applicant: Ferroelectric Memory GmbH, Dresden (DE)

(72) Inventors: Duc Le Minh, Dresden (DE); Stefano Sivero, Comun Nuovo (IT)

(73) Assignee: FERROELECTRIC MEMORY GMBH, Dresden (DE)

( * ) Notice: Subject to any disclaimer, the term of this patent is extended or adjusted under 35 U.S.C. 154(b) by 237 days.

(21) Appl. No.: 17/518,797

(22) Filed: Nov. 4, 2021

(65) Prior Publication Data

US 2023/0135718 A1    May 4, 2023

(51) Int. Cl.
  *G11C 5/14* (2006.01)
  *G05F 1/575* (2006.01)
(52) U.S. Cl.
  CPC .............. *G05F 1/575* (2013.01); *G11C 5/147* (2013.01)
(58) Field of Classification Search
  CPC ................................ G05F 1/575; G11C 5/147

USPC ...................................................... 365/189.09
See application file for complete search history.

(56) References Cited

U.S. PATENT DOCUMENTS 10,862,392 B2 *  12/2020  de Santis .............. H02M 3/073
2021/0012836 A1 *  1/2021  La Placa ............ G11C 13/0028

FOREIGN PATENT DOCUMENTS

JP         2002184177 A  *  6/2002

* cited by examiner

*Primary Examiner* — Huan Hoang
(74) *Attorney, Agent, or Firm* — Hickman Becker Bingham Ledesma LLP

(57) ABSTRACT

Disclosed herein is an adaptive voltage regulator that includes a voltage regulator circuit configured to provide a regulated output voltage at an output node of the adaptive voltage regulator circuit. The adaptive voltage regulator also includes an adaptation circuit coupled to the output node that is configured to adapt a charging characteristic associated with a charging of the output node to a predefined output voltage as a function of a load coupled to the output node. The adaption circuit may be configured to selectively provide additional charging current that charges the output node to the predefined output voltage depending on the load.

19 Claims, 11 Drawing Sheets

REGULATOR CIRCUIT AND METHODS THEREOF

TECHNICAL FIELD

Various aspects relate to a regulator circuit, e.g., a regulator circuit for a memory circuit, and methods thereof, e.g., a method of operating a regulator circuit.

BACKGROUND

In general, the generation of voltages having a stable and predefined value plays an important role for the operation of a variety of analog and digital circuits, such as voltage regulators. Various technologies are based on generating one or more predefined voltages by one or more voltage regulators. A field of application for a voltage regulator may include a read operation of memory cells. However, a memory cell has a narrow memory window (e.g., a small difference between the threshold voltages of a programmed state versus an erased state), which requires using a read voltage with considerable accuracy to ensure a proper read operation of the memory cell. Normally, the read voltage is generated by mean of a regulator in order to provide a stable voltage for biasing word-line. During a read operation, for example, depending on how the addresses may have changed compared to a previous read operation, the changed load may cause a dynamic current. As a result, the read voltage may vary, causing poor read performance and/or a read failure, especially for memory cells that have a narrow memory window.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a regulator circuit, a memory circuit, or a system including a regulator circuit and an array of memory cells). However, it may be understood that aspects described in connection with methods may similarly apply to the devices, and vice versa.

In general, a voltage regulator circuit may be used to generate a stable voltage, which may be used, for example, in a memory cell operation such as a read operation. The read operation may have a limited time window for performing the read operation, and the read voltage may need an accurate voltage during the time window to ensure a proper read operation. During a read operation, a voltage regulator may provide a voltage for biasing word-line voltage for the addressed memory cell, and depending on how the addresses may have changed compared to the address of a previous read operation, the load may change and cause a dynamic current at the voltage regulator. As a result, the regulated voltage may become unstable and may drop below a threshold level for ensuring a reliable read operation. According to various aspects, an adaptive voltage regulator described in more detail below may monitor control lines to determine how the address for the current read operation may have changed compared with the address for the previous read operation. Based on this address change information, the amount of available pull-up current may be increased in order to compensate for switching to a new read address that may exhibit a different load at the new address. By increasing the amount of available pull-up current, the drop in read voltage may be recovered more quickly so that the supplied voltage may return to the desired target read voltage (e.g., a predefined voltage) and provide a stable read voltage during the time window for the read operation. Such an adaptive voltage regulator may improve the accuracy of the read voltage during the read operation, thus improving the overall robustness of the read operation.

Figure 1:
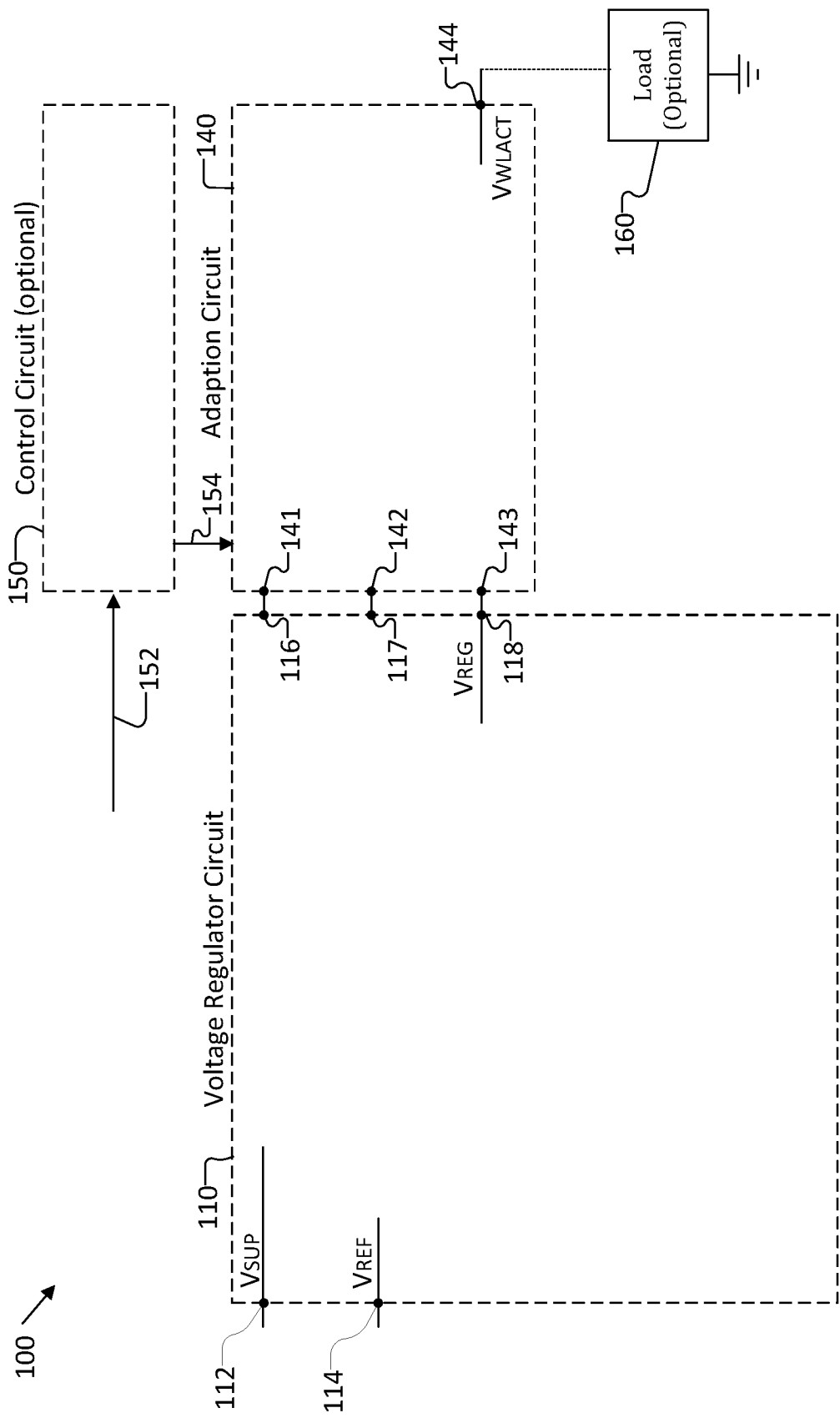
FIG. 1 shows an adaptive voltage regulator circuit in a schematic view, according to various aspects.

The term "voltage" may be used herein with respect to "a read out voltage", "a supply voltage", "an output voltage", and the like. As an example, the term "read out voltage" may be used herein to denote a voltage provided by a regulator circuit for reading out a memory state of a memory cell. As another example, the term "supply voltage" may be used herein to denote a voltage generated by a regulator circuit for operating a circuit (e.g., for operating a memory circuit FIG. 1 shows a circuit 100 for an adaptive voltage regulator in a schematic view according to various aspects. Circuit 100 may include a voltage regular circuit 110 and an adaption circuit 140 for generating a regulated voltage that may be supplied, for example, as a read out voltage (e.g. a predefined voltage output (e.g., a word-line voltage)) to an optional load 160 (e.g., the addressed memory cell for a read operation of a memory). The voltage regulator circuit 110 may receive a supply voltage (e.g., $V_{SUP}$) at a supply voltage input node 112 and a reference voltage (e.g., $V_{REF}$) at a reference voltage input node 114 that may be used by the voltage regulator circuit 110 for generating the regulated voltage (e.g., $V_{REG}$) at the regulated voltage node output 118 of the voltage regulator circuit 110 which may also be the regulated voltage (e.g., $V_{WLACT}$) at the regulated output voltage node 144 of the adaption circuit 140.

The adaption circuit 140 of circuit 100 may adapt the regulated voltage so as to adjust the available current actually supplied with the regulated voltage (e.g., $V_{WLACT}$) to the optional load 160 (e.g., the addressed memory cell for a read operation of a memory). The adaption circuit 140 may adjust the available current of the regulated voltage such that the adjustment is based on the extent of the address change (e.g., a change in the word-line, sector, and/or plane) of the memory cell for the current read operation as compared to the address of the memory cell for the previous read operation.

The adjustment by the adaption circuit 140 may be based on signals received from an optional control circuit 150. For example, control circuit 150 may include a trigger input 152 (e.g., one or more triggers associated with a change in a word-line, a sector, a plane, etc.) for the address of the memory cell that is to be read during a read operation. Based on the trigger input 152, the control circuit 150 may provide a control signal 154 (e.g. one or more control signals) to the adaption circuit 140 for controlling the adaption of the amount of available current supplied with the regulated voltage (e.g., $V_{WLACT}$) to the load (e.g., optional load 160). The adaption circuit 140 may also receive a supply voltage at supply voltage input node 141 that may be connected to a supply voltage output node 116 of the voltage regulator circuit 110. It should be appreciated that the supply voltage for voltage regulator circuit 110 may be externally supplied (e.g., from a supply voltage source external to the voltage regulator circuit 110) or internally generated within the voltage regulator circuit 110 (e.g., by means of a charge pump). Likewise, the supply voltage for voltage regulator circuit 110 may be externally supplied (e.g., from another supply voltage source external to the adaption circuit 140 (e.g., from the voltage regulator circuit 110)) or internally generated within the adaption circuit 140 (e.g., by means of a charge pump). The adaption circuit 140 may also receive a reference voltage at reference voltage input node 142 that may be connected to a reference voltage output node 117 of the voltage regulator circuit 110. The adaption circuit 140 may also include a regulated voltage input node 143 that may be connected to the regulated voltage output node 118 of the voltage regulator circuit 110 and may also be or be connected to a regulated voltage output node 144 of the adaption circuit 140. The regulated voltage output node 144 may supply the actual regulated voltage (e.g., $V_{WLACT}$) to a connected load (e.g., optional load 160). As should be appreciated, the regulated voltage output node 144 may be the same node as the regulated voltage input node 143. In some aspects, the circuits described herein may show nodes, e.g., regulated voltage input node 143 and regulated voltage output node 144. As should be appreciated, one or more nodes that may be electrically connected with one another may be implemented as a common node, may be portions of a common line, and may include any number of nodes that are electrically connected.

Figure 2:
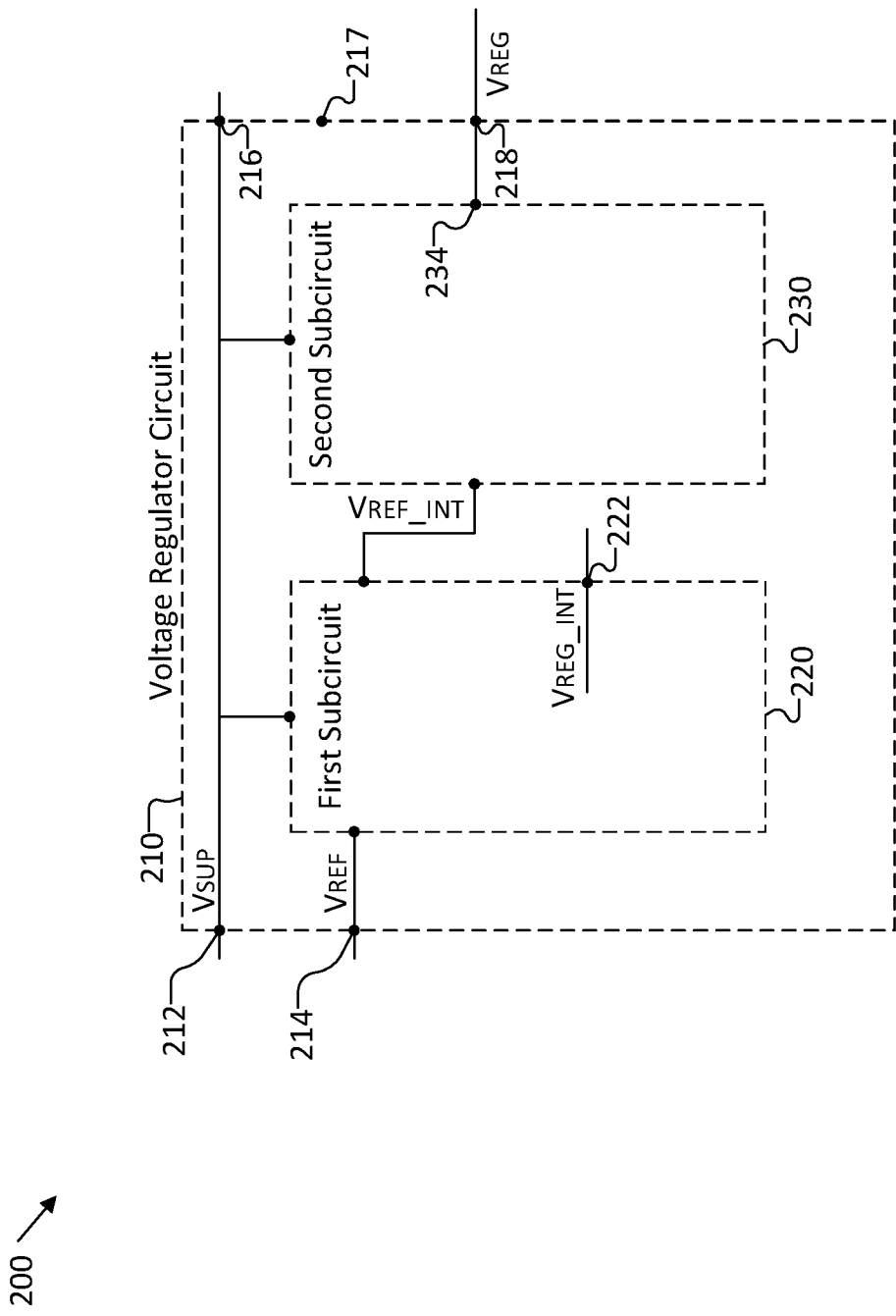
FIG. 2 shows an exemplary voltage regulator circuit of an adaptive voltage regulator in a schematic view, according to various aspects.

FIG. 2 shows a circuit 200 for an adaptive voltage regulator that depicts a voltage regulator circuit 210 that may be an exemplary embodiment of the voltage regulator circuit 110 described above with respect to circuit 100 of FIG. 1. It should be appreciated that voltage regulator circuit 210 is merely exemplary, and this example is not intended to limit voltage regulator circuit 110, which may be implemented in any number of ways.

The voltage regulator circuit 210 may receive a supply voltage (e.g., $V_{SUP}$) at a supply voltage input node 212 and a reference voltage (e.g., $V_{REF}$) at a reference voltage input node 214 that may be used by the voltage regulator circuit 210 for generating a regulated voltage (e.g., VREG) at a regulated voltage output node 218 of the voltage regulator circuit 210. The supply voltage input node 212 may be connected to a supply voltage output node 216. As should be appreciated, the supply voltage input node 212 and the supply voltage output node 216 may be the same node.

The voltage regulator circuit 210 may employ a first subcircuit 220 (e.g., a regulator branch), that may use the reference voltage (e.g., from reference voltage input node 214) to generate a regulated internal voltage (e.g., $V_{REG\_INT}$ or the primary regulated output voltage), which may be provided to an internal regulated voltage node 222 of the voltage regulator circuit 210. The first subcircuit 220 may generate a stable and configurable internal regulated voltage based on a temperature stable reference voltage (e.g., a bandgap reference voltage) received at the reference voltage input node 214. The first subcircuit 220 may also be connected to a second subcircuit 230 (e.g., a duplicate branch) in order to provide, for example, an internal reference voltage (e.g., $V_{REF\_INT}$) to the second subcircuit 230, which may be provided at an internal reference voltage output node 217. In addition, the second subcircuit 230 may be configured to provide a duplicate of the regulated internal voltage at a regulated voltage duplicate node 234. The voltage regulator circuit 210 may be configured to provide at the regulated voltage duplicate node 234 the same voltage value as is generated at the internal regulated voltage node 222 of the first subcircuit 220. The regulated voltage duplicate node 234 may be connected to the regulated voltage output node 218. Using the second subcircuit 230 to replicate the regulated internal voltage value provides an internal feedback mechanism that may improve the stability of the voltage regulator circuit 210 under the various load conditions that may be experienced at the regulated voltage output node 218.

Figure 3:
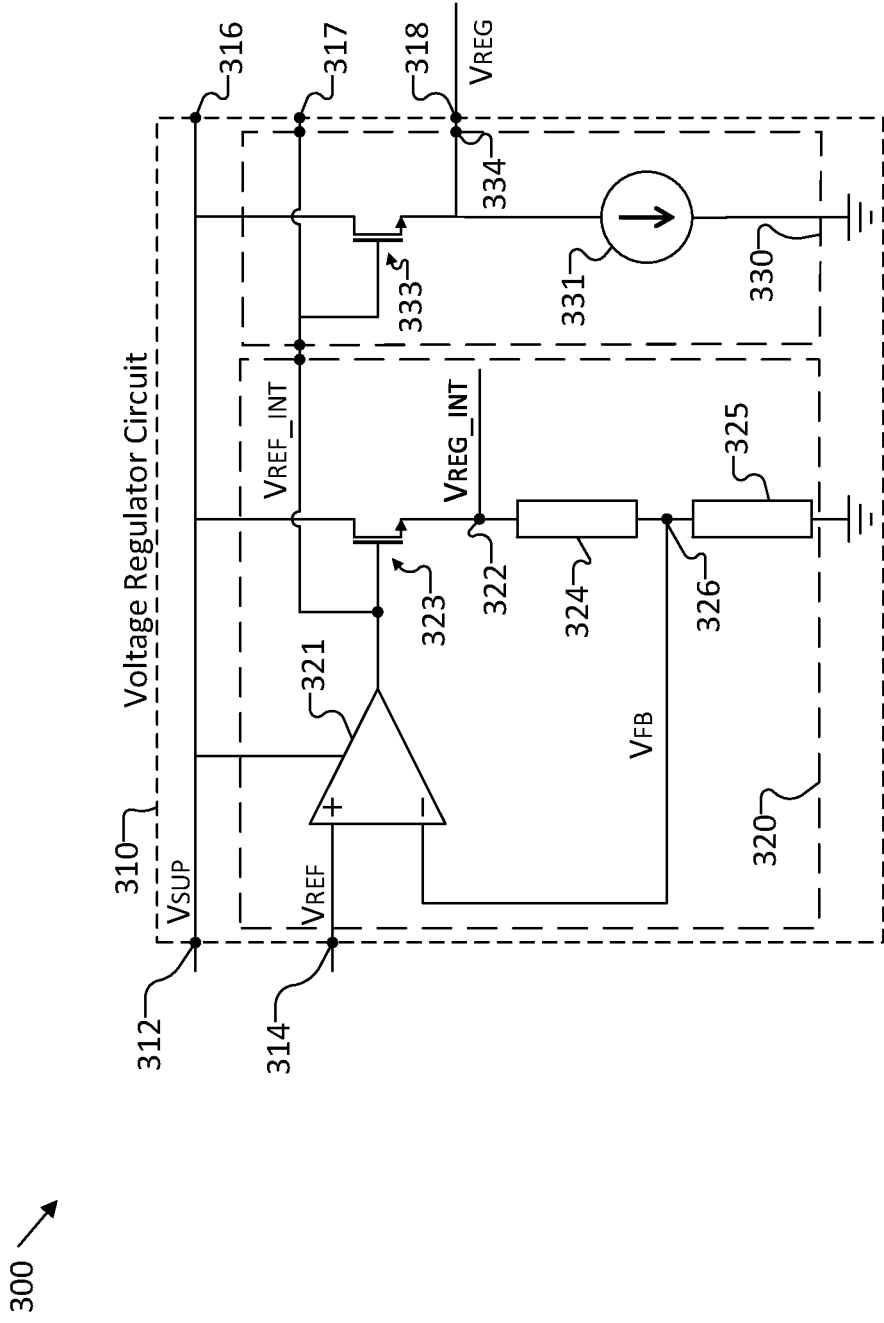
FIG. 3 shows an exemplary voltage regulator circuit of an adaptive voltage regulator in a schematic view, according to various aspects.

FIG. 3 shows a circuit 300 for an adaptive voltage regulator that depicts a voltage regulator circuit 310 that may be an exemplary embodiment of the voltage regulator circuit 110 described above with respect to circuit 100 of FIG. 1 and/or voltage regulator circuit 210 described above with respect to circuit 200 of FIG. 2. It should be appreciated that voltage regulator circuit 310 is merely exemplary, and this example is not intended to limit voltage regulator circuit 110 or voltage regulator circuit 210, which may be implemented in any number of ways.

The voltage regulator circuit 310 may receive a supply voltage (e.g., $V_{SUP}$) at a supply voltage input node 312 and a reference voltage ($V_{REF}$) at a reference voltage input node 314 that may be used by the voltage regulator circuit 310 for generating a regulated voltage (e.g., VREG) at a regulated voltage output node 318 of the voltage regulator circuit 310.

The voltage regulator circuit 310 may employ a first subcircuit 320 (e.g., a regulator branch), that may use the reference voltage (e.g., from reference voltage input node 314) to generate a regulated internal voltage (e.g., $V_{REG\_INT}$), which may be provided to an internal regulated voltage node 322 of the voltage regulator circuit 310. The first subcircuit 320 may use an amplifier 321 in combination with a field-effect transistor 321 in a source follower configuration that provides a feedback voltage (e.g., $V_{FB}$) to the amplifier 321. The feedback voltage may be set by, for example, using a voltage divider. For example, the feedback voltage may be set at a feedback voltage node 326 that is located between a first feedback resistor 324 and second feedback resistor 326 that together form the voltage divider. In such a configuration, the first subcircuit 320 forms a feedback loop and generates a stable, configurable regulated internal voltage (e.g., $V_{REG\_INT}$) based on the reference voltage ($V_{REF}$).

The first subcircuit 320 may also be connected to a second subcircuit 330 (e.g., a duplicate branch) in order to provide, for example, the internal reference voltage (e.g., $V_{REF\_INT}$) to the second subcircuit 330, which may also be connected to an internal reference voltage output node 317 of the voltage regulator circuit 310. The second subcircuit 330 may use a field effect transistor 333 in a source follower configuration to duplicate the internal regulated voltage at the regulated voltage duplicate node 334, as a duplicate voltage, such that it has the same voltage value as primary regulated output voltage (i.e., the voltage value generated at the internal regulated voltage node 322 of the first subcircuit 220). In order to duplicate the internal regulated voltage, the second subcircuit 330 may use the internal reference voltage from the first subcircuit 320, which may connect the gate of the field-effect transistor 323 of the first subcircuit 320 with the gate of the field-effect transistor 333 of the second subcircuit 330. Using the second subcircuit 330 to replicate the regulated internal voltage provides an internal feedback mechanism that may improve the stability of the voltage regulator circuit 310 under various the load conditions that may be experienced at the regulated voltage output node 318.

The second subcircuit 330 may be biased by a biasing source 331. Biasing source 331 may be, for example, a field effect transistor that is configured with a bias voltage (e.g., at the gate of the field effect transistor). In addition, the regulated voltage duplicate node 334 may be connected to the regulated voltage output node 318 of the voltage regulator circuit 310, and the internal reference voltage may be provided to an internal reference voltage output node 317 of the voltage regulator circuit 310.

Figure 4:
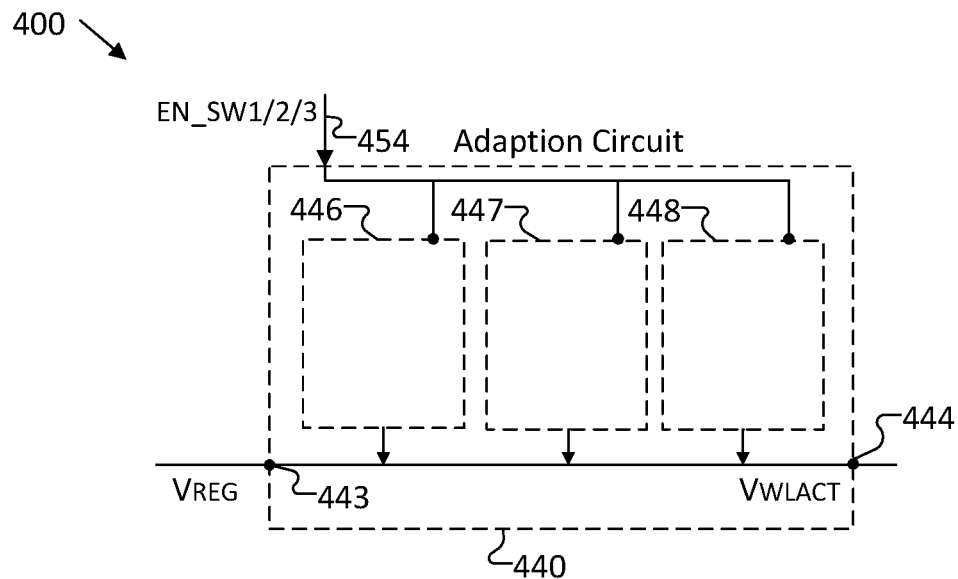
FIG. 4 shows an exemplary adaption circuit of an adaptive voltage regulator in a schematic view, according to various aspects.

FIG. 4 shows a circuit 400 for an adaptive voltage regulator that depicts an adaption circuit 440 that may be an exemplary embodiment of the adaption circuit 140 described above with respect to circuit 100 of FIG. 1. It should be appreciated that adaption circuit 440 is merely exemplary, and this example is not intended to limit adaption circuit 140, which may be implemented in any number of ways.

The adaption circuit 440 of circuit 400 may adapt a regulated voltage so as to adjust the available current actually supplied with the regulated voltage (e.g., $V_{WLACT}$) to the optional load (e.g., the addressed memory cell for a read operation of a memory) (not pictured in FIG. 4). The adjustment by the adaption circuit 440 may be based on one or more control signals 454 (e.g., switch-enabling signals (e.g., EN_SW1/2/3)). The control signals may be representative of the desired adjustment to the current actually made available with the regulated voltage (e.g., $V_{WLACT}$) to the load. The regulated voltage may be provided at regulated voltage output node 444 of the adaption circuit 440, and the regulated voltage output node 444 may be or be connected to a regulated voltage input node 443.

In order for the adaption circuit 440 to adjust the available current actually supplied with the regulated voltage, the adaption circuit 440 may enable a variable number of current-sourcing circuits (e.g., current-sourcing circuits 446, 447, and/or 448) that may be enabled or disabled, depending on the received control signals 454. It should be appreciated that while three configurable current-sourcing circuits have been depicted in FIG. 4, any number of current-sourcing circuits may be used (e.g., 1, 2, 3, 4, 5, 6, etc.), where the total number of current-sourcing circuits will set the maximum available current that may be supplied with the regulated voltage. It should also be appreciated that while the current-sourcing circuits 446, 447, and 448 are depicted in FIG. 4 as being connected in parallel, it should be appreciated that current-sourcing circuits may be connected in series, parallel, or a combination of both.

In operation, the control signals 454 may indicate, based on the desired available current, that one of the current-sourcing circuits should be enabled, and in response, the adaption circuit 440 may enable one of the current-sourcing circuits (e.g., current-sourcing circuit 446) while not enabling (e.g., disabling) the remaining current-sourcing circuits (e.g., current-sourcing circuits 447 and 448). In order to increase the available current actually supplied with the regulated voltage, the control signals 454 may indicate that two of the current-sourcing circuits should be enabled, and in response, the adaption circuit 440 may enable two current-sourcing circuits (e.g., current-sourcing circuits 446 and 447) while disabling the remaining current-sourcing circuits (e.g., current-sourcing circuit 448). If even more additional current is desired, the control signals 454 may indicate that all three current-sourcing circuits 446, 447, and 448 should be enabled. If the adaption circuit 440 contains additional current-sourcing circuits beyond the three depicted, the maximum available current that may be configured by the control signals 454 may correspond to the total number of current-sourcing circuits used in the adaption circuit 440. It should also be appreciated that while the one or more control signals 454 have been depicted as a single control line connected to the current-sourcing circuits, it should be appreciated that the control signals 454 may be comprised of separate control lines, where each control line is connected to (e.g. dedicated to) a corresponding current-sourcing circuit that allows for individually controlling each current-sourcing circuit with an individual control line.

Figure 5:
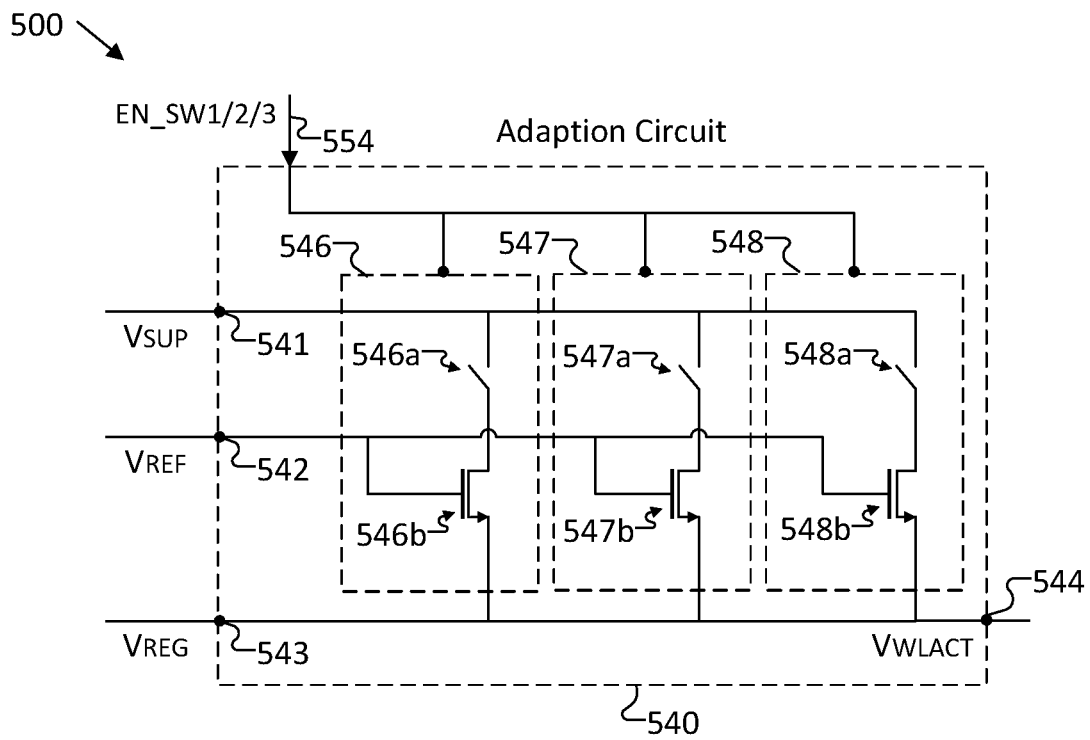
FIG. 5 shows an exemplary adaption circuit of an adaptive voltage regulator in a schematic view, according to various aspects.

FIG. 5 shows a circuit 500 for an adaptive voltage regulator that depicts an adaption circuit 540 that may be an exemplary embodiment of the adaption circuit 140 described above with respect to circuit 100 of FIG. 1 or the adaption circuit 440 described above with respect to circuit 400 of FIG. 4. It should be appreciated that adaption circuit 540 is merely exemplary, and this example is not intended to limit adaption circuit 140 or adaption circuit 440, which may be implemented in any number of ways.

The adaption circuit 540 of circuit 500, similar to circuit 400, may adapt a regulated voltage so as to adjust the available current actually supplied with the regulated voltage (e.g., $V_{WLACT}$) to the optional load (e.g., the addressed memory cell for a read operation of a memory) (not pictured in FIG. 5). The adjustment by the adaption circuit 540 may be based on one or more control signals 554 (e.g., switch-enabling signals (e.g., EN_SW1/2/3)). The control signals may be representative of the desired adjustment to the current actually made available with the regulated voltage (e.g., $V_{WLACT}$) to the load. The regulated voltage may be provided at regulated voltage output node 544 of the adaption circuit 540, and the regulated voltage output node 544 may be or be connected to a regulated voltage input node 543.

In order for the adaption circuit 540 to adjust the available current actually supplied with the regulated voltage, the adaption circuit 540 may enable a variable number of current-sourcing circuits (e.g., current-sourcing circuits 546, 547, and/or 548) that may be enabled or disabled, depending on the control signals 554. It should be appreciated that while three such configurable current-sourcing circuits have been depicted in FIG. 5, any number of current-sourcing circuits may be used (e.g., 1, 2, 3, 4, 5, 6, etc.), where the total number of current-sourcing circuits will set the maximum available current that may be supplied with the regulated voltage. It should also be appreciated that while the current-sourcing circuits 546, 547, and 548 are connected in parallel, it should be appreciated that current-sourcing circuits may be connected in parallel, series, or a combination of both.

Each of the current-sourcing circuits (e.g., current-sourcing circuits 546, 547, and/or 548) may include a switch and a field effect transistor, where each respective current-sourcing circuit may be enabled by its associated switch. Using current-sourcing circuit 546 as an example, current-sourcing circuit 546 may comprise a switch 546a that is configured to enable or disable the current-sourcing ability of the field effect transistor 546b (e.g., enable current to flow from $V_{SUP}$ to VREG). As should be appreciated from the circuit, the field effect transistor 546b will be activated and deactivated by the voltage difference between $V_{REF}$ and VREG. When the current-sourcing circuit is enabled, the field effect transistor 546b be may supply current for the regulated voltage (e.g., $V_{REF}$, $V_{WLACT}$). When the current-sourcing circuit is disabled, the field effect transistor 546b may no longer supply current for the regulated voltage.

The field effect transistor 546b may be in a source-follower configuration, as depicted in FIG. 5. In such a configuration, switch 546a may be used to connect and disconnect the drain terminal of field effect transistor 546b to a supply voltage (e.g., $V_{SUP}$), thereby enabling and disabling the ability of the field effect transistor 546b to supply current. The gate of field effect transistor 546b may be fed by a reference voltage (e.g., $V_{REF}$), and the source terminal of field effect transistor 546b may be connected to the regulated voltage (e.g., VREG, $V_{WLACT}$) at a regulated voltage node (e.g. regulated voltage input node 543 and/or regulated voltage output node 544). Although a source-follower configuration is depicted for each of the current-sourcing circuits of FIG. 5, it should be appreciated that other transistor configurations may be used to selectively supply current for the regulated voltage.

Figure 6:
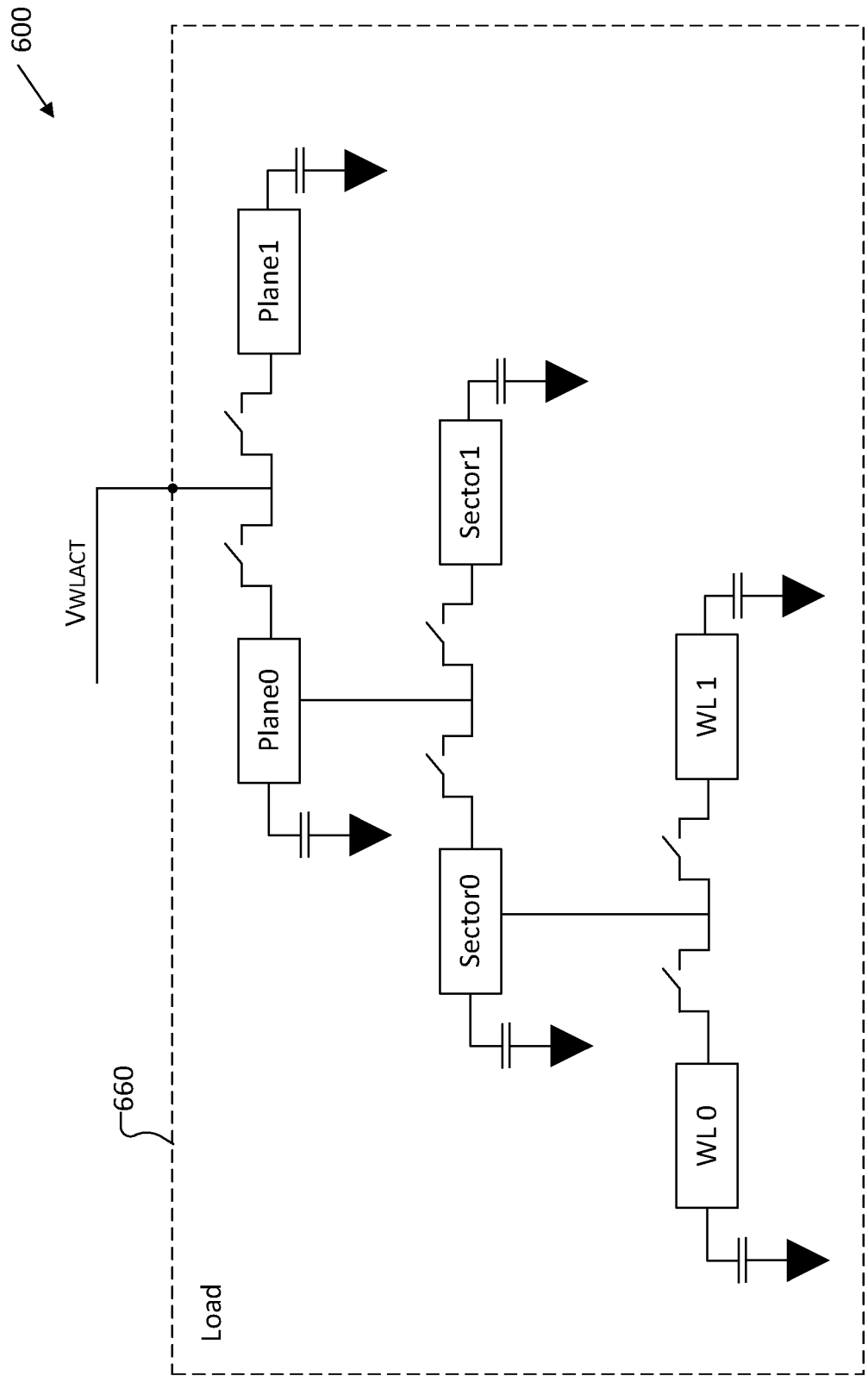
FIG. 6 shows an exemplary capacitive load model in a schematic view, which may be used in conjunction with an adaptive voltage regulator.

FIG. 6 shows a capacitive load model 600 of a variable load 660 that may be the optional load to which the regulated voltage is supplied. The variable load 660 may be an exemplary model of the optional load 160 described above with respect to circuit 100 of FIG. 1 and subsequent figures. It should be appreciated that variable load 660 is merely exemplary, and this example is not intended to limit optional load 160, which may be modeled in any number of ways.

Capacitive load model 600 may model a memory circuit that has an array of memory cells that are arranged and addressable by word, sector, and plane for operating the memory circuit to read, write, erase, etc. at the addressed memory cell(s). Depending on which memory cell(s) are addressed for a given memory operation (e.g., a read operation), the effective load seen by a circuit (e.g., a voltage regulator) connected to the variable load 660 may change. Thus, when the addressed memory cell changes from one operation to the next, the effective load (e.g., capacitance) may change in proportion to the extent of the address change.

For example, if only the word-line for the addressed cell has changed (e.g., from WL0 to WL1, or vice-versa) and the sector and plane have remained the same, there may be a relatively small change in capacitance seen by a circuit (e.g., a voltage regulator) connected to the variable load 660. If the sector for the addressed cell has changed (e.g., from SECTOR1 to SECTOR0 or vice-versa) and plane has remained the same, there may be a larger change in capacitance seen by the circuit connected to the variable load 660, given that the both the word-line and sector have changed. If all three dimensions of the address have changed (e.g. due to a page change from PAGE0 to PAGE1 or vice-versa), there may be an even higher change in capacitance seen by the circuit connected to the variable load 660. While a memory cell with three dimensions has been shown in FIG. 6, it should be appreciated that such a memory cell may have any number of dimensions, and that a change in each dimension from one operation to the next may cause a cumulative change in the effective load.

As should be understood from load model 600, a change in the load may cause a voltage change (e.g., a voltage drop) in the voltage supplied by a circuit attached to the variable load (e.g., a voltage regulator supplying $V_{WLACT}$ to a memory circuit) due to the dynamic current. Such a voltage change may be undesirable when the memory circuit requires a stable and accurate voltage supply for the operation (e.g. a read operation) of the memory circuit, where an inaccurate or unstable voltage may impact performance of the operation and may cause a read failure. The adaptive voltage regulator described above (e.g., the adaptive voltage regulator circuit 100 described above) may be configured to compensate for such load changes through the use of an adaption circuit (e.g., adaption circuit 140, adaption circuit 440, or adaption circuit 540 described above), which may be controlled by an optional control circuit (e.g., control circuit 140 described above). The optional control circuit will be discussed in more detail below.

Figure 7:
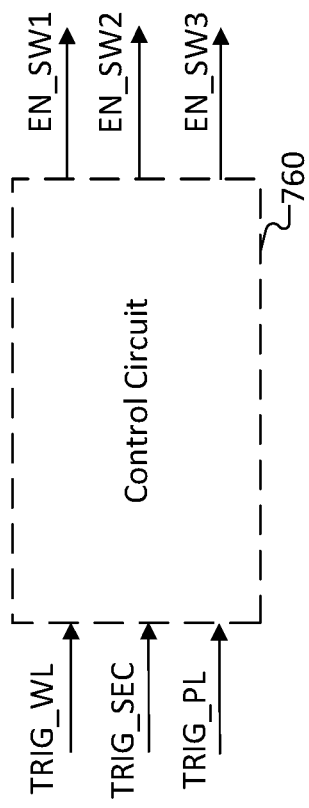
FIG. 7 shows an exemplary control circuit for an adaptive voltage regulator in a schematic view, according to various aspects.

FIG. 7 shows a control circuit 760 for generating control signals for an adaptive voltage regulator. Control circuit 760 may be an exemplary embodiment of the control circuit 150 described above with respect to circuit 100 of FIG. 1. It should be appreciated that control circuit 760 is merely exemplary, and this example is not intended to limit control circuit 150, which may be implemented in any number of ways.

Control circuit 760 may receive one or more trigger signals (e.g., TRIG_WL, TRIG_SEC, and/or TRIG_PL) corresponding to how the dimension(s) of the memory cell address have changed from the previously addressed cell to the currently addressed cell. The trigger signals may be provided from a memory controller (e.g., a processor (not shown)), and each trigger signal may be dedicated for a particular dimension of the memory cell. For example, for a memory with word-line, sector, and page dimensions, TRIG_WL may be dedicated to word-line changes and may be toggled (either from high to low or from low to high) if the word-line for the currently addressed memory cell has changed from the word-line of the previously addressed memory cell. Similarly, TRIG_SEC may be dedicated to sector changes and may be toggled if the sector for the currently addressed memory cell has changed from previously addressed memory cell. TRIG_PL may be dedicated to page changes and may be toggled if the page for the currently addressed memory cell has changed from previously addressed memory cell.

In addition, one dedicated trigger may be dependent on another dedicated trigger, such that if one trigger toggles (e.g., from high to low), then its dependent trigger(s) also toggle. As one example, if TRIG_PL toggles, this may also cause TRIG_SEC and TRIG_WL to toggle. As another example, if TRIG_SEC toggles, this may also cause TRIG_WL to toggle. This is because a memory cell in a new sector may necessarily be associated with a different word-line and a memory cell in a new page may necessarily be associated with a different sector and different word-line.

For each trigger signal, the control circuit 760 may generate a corresponding control signal (e.g., EN_SW1, EN_SW2, EN_SW3) for the adaption circuit (e.g., adaption circuit 140, adaption circuit 440, or adaption circuit 540 described above). The control signals may be generated by mean of a pulse generation circuit, where the resulting pulses are configured to enable the current-sourcing circuits of the adaption circuit (e.g., adaption circuit 140), and the configuration of the control signals may depend on its corresponding trigger signal. For example, where the current-sourcing circuits include switches, each pulse may be configured to enable a switch for a corresponding current-sourcing circuit based on whether its corresponding trigger has toggled. In addition, the timing of the pulses of the control signals may be set to a particular time period and duration so that the adaption circuit may provide additional current for the regulated voltage (e.g., provide additional current to charge $V_{WLACT}$). to ensure a stable voltage for the duration of the read operation.

In operation, when the address for the currently addressed memory cell is at the same word-line, page, and sector as the previously addressed memory cell, TRIG_WL, TRIG_SEC, and TRIG_PL may not toggle, and the control circuit 760 may configure all three control signals (e.g., EN_SW1, EN_SW2, and EN_SW3) to not enable (e.g., to disable) each of the corresponding current-sourcing circuits of the adaption circuit. When the address for the currently addressed memory cell is at a different word-line, sector, and page as the previously addressed memory cell, TRIG_WL, TRIG_SEC, and TRIG_PL may toggle, and the control circuit 760 may configure all three control signals control signals (e.g., EN_SW1, EN_SW2, and EN_SW3) to enable each of the corresponding current-sourcing circuits of the adaption circuit. More generally, depending on which of the word-line, sector, and/or page of the currently addressed memory cell compared to the previously addressed memory cell changes, a corresponding trigger line may toggle (TRIG_WL, TRIG_SEC, and/or TRIG_PL), and the control circuit 760 may configure the control signals (EN_SW1, EN_SW2, and/or EN_SW3) to enable an appropriate number of current-sourcing circuits in the adaption circuit. In this manner, the regulated voltage may remain stable for the duration of the operation (e.g. during a read operation of an addressed memory cell), even though the load may have changed from the previous operation.

Figure 8:
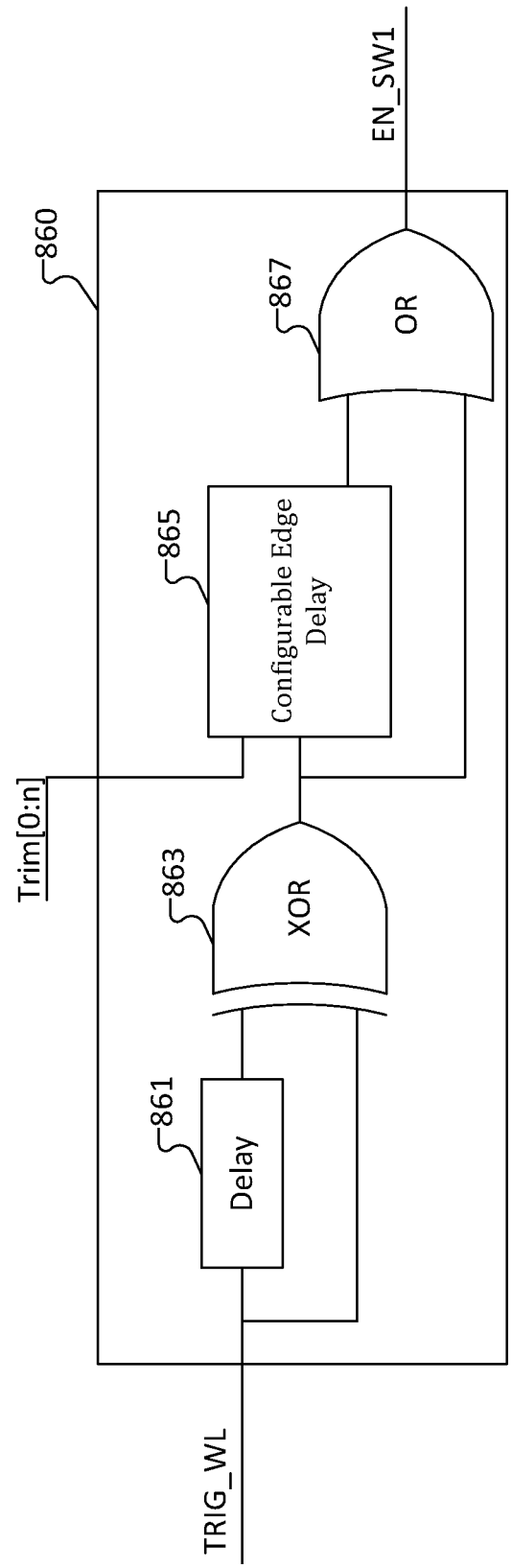
FIG. 8 shows an exemplary control circuit for an adaptive voltage regulator in a schematic view, according to various aspects.

FIG. 8 shows an exemplary control circuit 860 for generating control signals from received trigger signals. Control circuit 860 may be an exemplary embodiment of the control circuit 150 described above with respect to circuit 100 of FIG. 1 or control circuit 750 described above with respect to FIG. 7. It should be appreciated that control circuit 860 is merely exemplary, and this example is not intended to limit control circuit 160 or control circuit 760, which may be implemented in any number of ways. It should also be appreciated that while only one representative trigger (TRIG_WL) and a corresponding control signal (EN_SW1) is shown in FIG. 8, the control circuit 860 may include any number of triggers with corresponding control signals, including, for example, one for each dimension of the memory array (e.g., for a memory with word-line, sector, and page dimensions, trigger lines TRIG_WL, TRIG_SEC and TRIG_PL corresponding to control lines EN_SW1, EN_SW2, and EN_SW3). Control circuit 860 may be designed to monitor for toggled trigger signals for the current operation as compared to the previous read operation, and then enable control signals (e.g., pulses) corresponding to each toggled trigger signal.

Control circuit 860 may include a delay circuit 861 and a configurable edge delay circuit 865 that may be configured to cover the duration of time it takes for the regulated voltage to stabilize from a change to the load seen by the voltage regulator. The trigger signal (e.g. TRIG_WL) may feed into the delay circuit 861 and into an input of an exclusive-OR (XOR) logic gate 863. The output of the delay circuit 861 may feed into another input of XOR logic gate 863. The XOR logic gate 863 compares the current trigger signal (e.g., TRIG_WL) to a delayed version of the trigger signal (e.g., delayed TRIG_WL at the output of delay circuit 861), to generate a pulse with a duration equal to the delay time (e.g., nanoseconds).

The output of the XOR logic gate 863 may be fed into a configurable edge delay circuit 865 and into an input of an OR logic gate 867. The output of the configurable edge delay circuit 861 may feed into another input of the OR logic gate 867. Using a trimming control signal provided to the configurable edge delay circuit 865, the duration of the pulse signal (e.g., EN_SW1) provided at the output of the OR logic gate 867 may be adjusted. The edge delay may be configured to cover the duration of time it takes for the regulated voltage to stabilize from a changed load seen by the voltage regulator.

Figure 9:
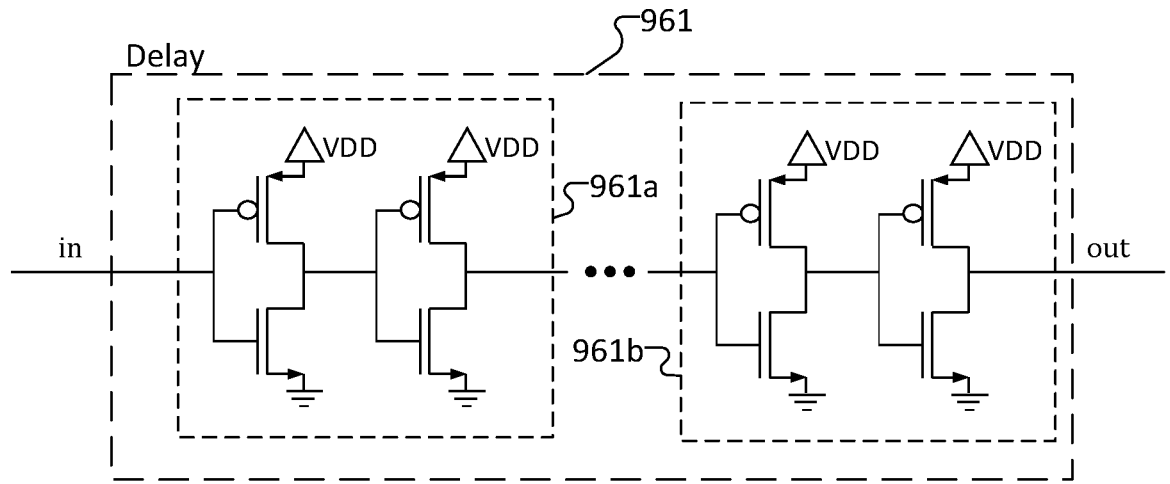
FIG. 9 shows an exemplary delay circuit for a control circuit in a schematic view, according to various aspects.

FIG. 9 shows an exemplary delay circuit 961 for implementing a delay. Delay circuit 961 may be an exemplary embodiment of the delay circuit 861 described above with respect to FIG. 8. It should be appreciated that delay circuit 961 is merely exemplary, and this example is not intended to limit delay circuit 861, which may be implemented in any number of ways. Delay circuit 861 may include delay logic, including, for example, a series of non-inverting buffers, that provide a delay from the input to the output. As shown, for example, in FIG. 9, a series of two non-inverting buffers (e.g., non-inverting buffer 961a connected in series with non-inverting buffer 961b) may be used to provide the desired delay, but more or less non-inverting buffers may be used to provide the delay, and any type of logic may be used.

Figure 10:
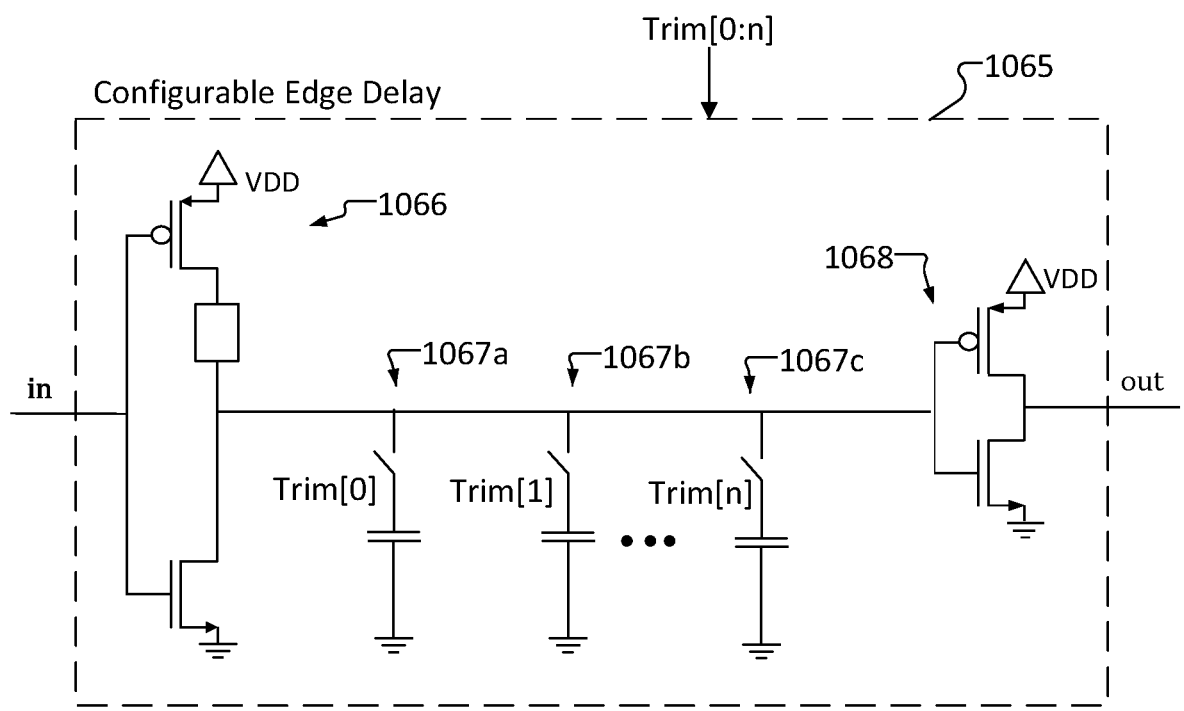
FIG. 10 shows an exemplary configurable edge delay circuit for a control circuit in a schematic view, according to various aspects.

FIG. 10 shows an exemplary configurable delay circuit 1065 for implementing a configurable delay. Delay circuit 1065 may be an exemplary embodiment of the configurable delay circuit 865 described above with respect to FIG. 8. It should be appreciated that configurable delay circuit 1065 is merely exemplary, and this example is not intended to limit configurable delay circuit 865, which may be implemented in any number of ways.

Configurable delay circuit 1065 may include two inverters (e.g., inverter 1066 and inverter 1068) connected in series that are separated by an array of trimming circuits 1067a, 1067b, 1067c, each of which may be connected between the output of inverter 1066 and the input of inverter 1068. In addition, each trimming circuit may be enabled or disabled to add or remove an increment of delay associated with the corresponding trimming circuit. As such, the total delay of the configurable delay circuit 1065 will be the delay of the inverters 1066 and 1067 along with the sum of the incremental delays provided by each enabled trimming circuit. While three trimming circuits have been shown in FIG. 10, it should be appreciated that any number of trimming circuits may be used, depending on the desired magnitude and increment for the trimmable delay.

The configurable delay circuit 1065 may include one or more trimming control signals (e.g., Trim[0:n]) that may be used to adjust the overall delay by enabling or disabling one or more trimming circuits corresponding to the trimming control signals. As shown in FIG. 10, the trimming control signals may enable or disable switches associated with each trimming circuit to either switch in or switch out the delay associated with the corresponding trimming circuit. Although each trimming circuit in FIG. 10 is shown as a switched capacitor, any type of switchable circuitry may be used to provide the incremental delay for each trimming circuit.

Figure 11:
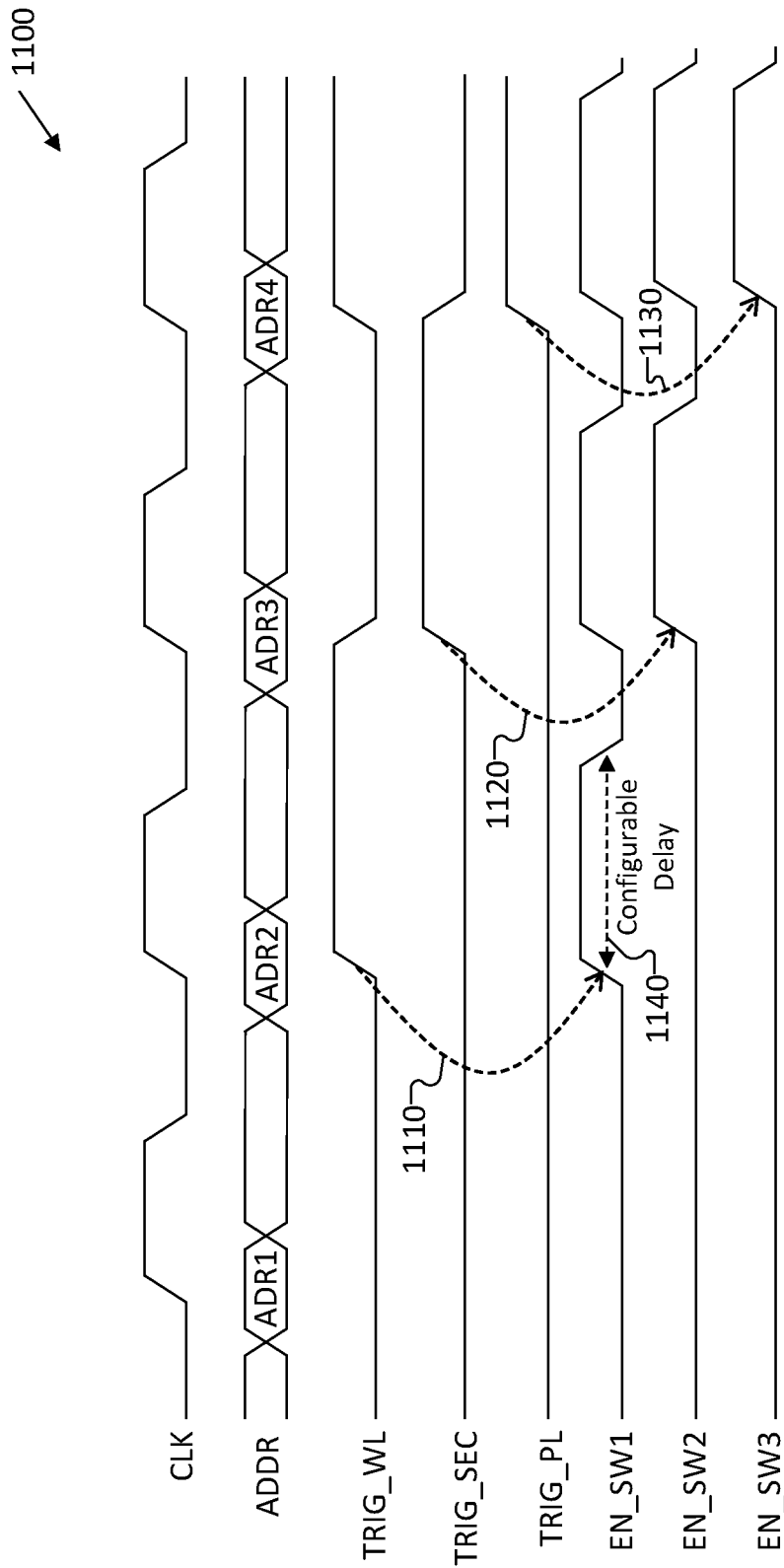
FIG. 11 shows a timing diagram that may be associated with an operation of an adjustable voltage regulator to drive an optional load, according to various aspects.

FIG. 11 shows an exemplary timing diagram 1100 associated with an operation of an adaptive voltage regulator. The adaptive voltage regulator may be an exemplary configuration of the adaptive voltage regulator circuit 100 described above. The first line in timing diagram 1100 is a clock pulse that defines the duration and timing of successive operations (e.g., a read operation of a connected memory array). In this example, the read operation occurs while the clock is high. The next two lines of timing diagram 1100 are addressing lines that provide the memory address for the current operation. In this example, the address lines relate to a memory array that is dimensioned by word-line, sector, and page. In this example, the transition from ADR1 to ADR2 involves a word-line change in the same sector and page, the transition from ADR2 to ADR3 involves a sector change in the same page, and the transition from ADR3 to ADR4 involves a page change. The TRIG_WL, TRIG_SEC, and TRIG_PL lines are trigger lines that toggle to indicate which dimensions of the address have changed from the prior operation to the current operation. The EN_SW1, EN_SW2, and EN_SW3 lines are control lines (e.g. from optional control circuit 150 that may be used to enable/disable the current-sourcing circuits of the adaption circuit (e.g., adaption circuit 140)).

As can be seen at ADR2, the TRIG_WL line has toggled from low to high due to the word-line change from ADR1 at the previous operation (at the rising clock cycle for ADR1) as compared to ADR2 for the current operation (at the rising clock cycle for ADR2). As a result of this toggle (see arrow 1110), the EN_SW1 is enabled for the duration of the read cycle. As can be seen at ADR3, the TRIG_WL and TRIG_SEC lines have toggled due to the sector change from ADR2 in the previous operation to ADR3 in the current operation. As a result of this toggle (see arrow 1120), the EN_SW1 and EN_SW2 are enabled for the duration of the read cycle. As can be seen at ADR4, the TRIG_WL, TRIG_SEC, and TRIG_PL have all toggled due to the page change from ADR3 in the previous operation to ADR4 for the current operation. As a result (see arrow 1130), EN_SW1, EN_SW2, and EN_SW3 are enabled for the duration of the read cycle.

The duration of a pulse (e.g. the width) for an enabled control line (e.g., EN_SW1, EN_SW2, or EN_SW3) may be configured using a configurable edge delay (e.g. the configurable edge delay 865 and 1065 discussed above with regard to FIG. 8 and FIG. 10, respectively). By adjusting the configurable edge delay, the pulse width 1110 of the enabled control line may be adjusted to a desired width. The pulse width may be configured, for example, to cover the duration of time it takes during an operation for the regulated voltage to stabilize from a changed load. The duration of the pulse may be configured so as to be independent from the clock, whereas transitions of the trigger signals may be configured so as to be synchronized with the clock.

Figure 12:
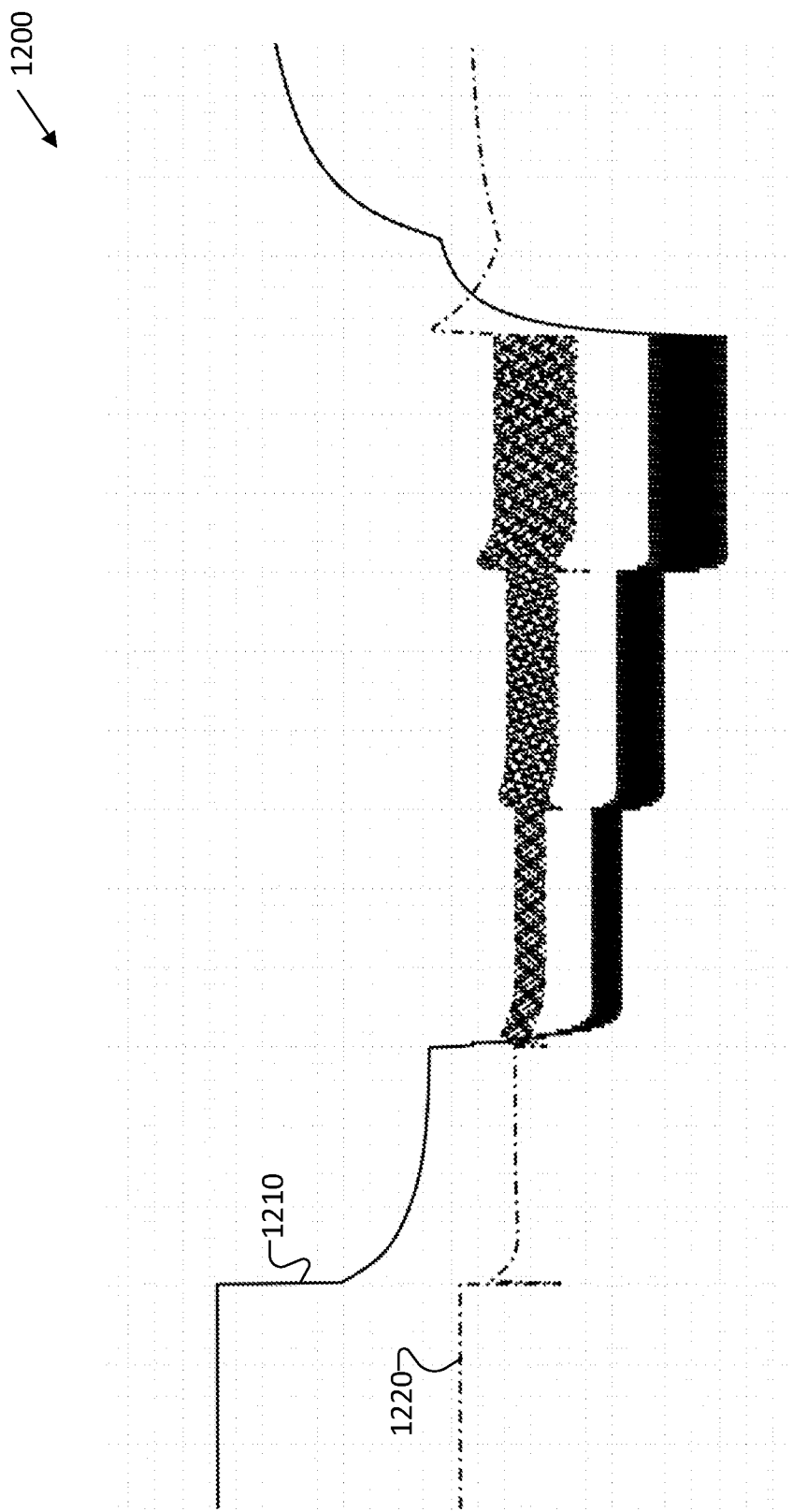
FIG. 12 shows an exemplary simulation graph showing the voltage response of regulated voltages, according to various aspects.

FIG. 12 shows an exemplary simulation graph 1200 that shows the voltage response of the regulated voltage supplied by a conventional voltage regulator as compared to a regulated voltage supplied by an exemplary adaptive voltage regulator described above. Plot 1210 (the solid-lined plot) shows a significant voltage drop in the regulated voltage when the output load changes. Plot 1220 (the dashed-line plot) shows a significant improvement in the stability of the regulated voltage, where there is less of a voltage drop when the output load changes.

Figure 13:
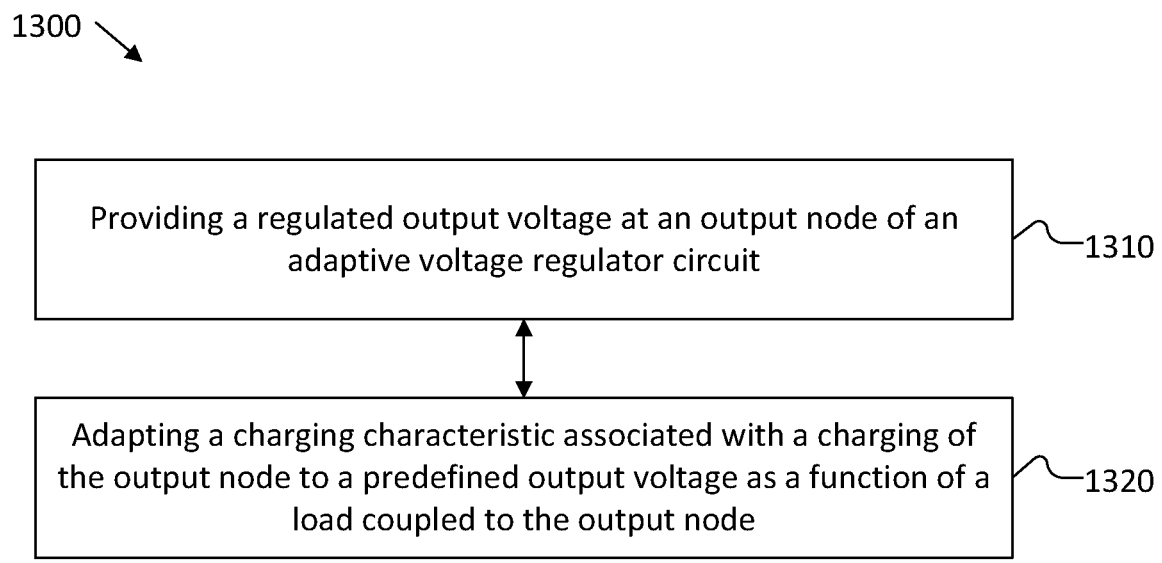
FIG. 13 depicts an exemplary schematic flow diagram of a method for voltage regulation.

FIG. 13 depicts an exemplary schematic flow diagram 1300 of a method for voltage regulation. Method 1300 may implement any of the features and/or structures described above with respect to the adaptive voltage regulator circuit of FIG. 1, the voltage regulator circuits of FIGS. 2 and 3, the adaption circuits of FIGS. 4 and 5, the capacitive load model of FIG. 6, the control circuits of FIGS. 7 and 8., the delay circuit of FIG. 9, and/or the configurable edge delay of FIG. 10.

Method 1300 includes, in 1310, providing a regulated output voltage at an output node of an adaptive voltage regulator circuit. Method 1300 also includes, in 1320, adapting a charging characteristic associated with a charging of the output node to a predefined output voltage as a function of a load coupled to the output node. Adapting the charging characteristic 1320 of method 1300 may include providing a first additional charging current if the load is a first load, providing a second additional charging current if the load is a second load, wherein the first additional charging current is different from the second additional charging current, and wherein the second load is different from the first load.

Method 1300 may further include receiving a control signal indicating whether the first load or the second load is coupled to the output node as the load. Method 1300 may also include adapting the charging characteristic based on the control signal. Method 1300 may further include comparing an actual voltage value of the regulated output voltage with a reference voltage value by a feedback loop. Method 1300 may further include regulating the actual voltage value to be substantially equal to the predefined output voltage, wherein the predefined output voltage is based on the reference voltage value. Method 1300 may further include generating a primary regulated output voltage based on a reference voltage. Method 1300 may also include providing the regulated output voltage to the output node as a duplicate voltage of the primary regulated output voltage. The receiving the control signal may also include generating one or more generated pulses and adjusting a duration of each of the one or more pulses. Method 1300 may also include providing, based on a trim enablement signal, an incremental delay to the trimming circuit.

Figure 14:
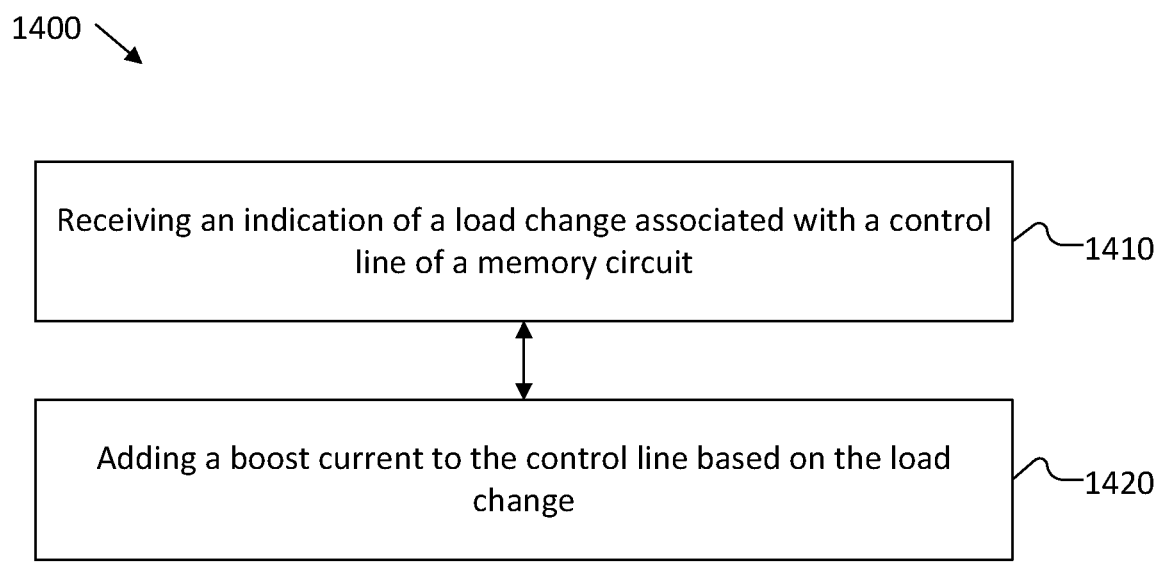
FIG. 14 depicts an exemplary schematic flow diagram of a method providing a regulated output voltage to a control line of a memory circuit.

FIG. 14 depicts an exemplary schematic flow diagram 1400 of a providing a regulated output voltage to a control line of a memory circuit. Method 1400 may implement any of the features and/or structures described above with respect to the adaptive voltage regulator circuit of FIG. 1, the voltage regulator circuits of FIGS. 2 and 3, the adaption circuits of FIGS. 4 and 5, the capacitive load model of FIG. 6, the control circuits of FIGS. 7 and 8., the delay circuit of FIG. 9, and/or the configurable edge delay of FIG. 10.

Method 1400 includes, in 1410, receiving an indication of a load change associated with a control line of a memory circuit. Method 1400 also includes, in 1420, adding a boost current to the control line based on the load change. The control line of method 1400 may include a word-line of the memory circuit. Adding the boost current to the control line of method 1400 may include switching in one or more current-sourcing circuits that each provide an additional supply of current to the control line.

In the following, various examples are provided that may include one or more aspects described above with reference to a regulator circuit (e.g., the regulator circuit 100). It may be intended that aspects described in relation to the regulator circuit may apply also to the described method(s), and vice versa.

Example 1 is an adaptive voltage regulator circuit that includes a voltage regulator circuit configured to provide a regulated output voltage at an output node of the adaptive voltage regulator circuit. The adaptive voltage regulator also includes an adaptation circuit coupled to the output node and configured to adapt a charging characteristic associated with a charging of the output node to a predefined output voltage as a function of a load coupled to the output node.

Example 2 is the adaptive voltage regulator of example 1, wherein the adaption circuit configured to adapt the charging characteristic associated with the charging of the output node to the predefined output voltage as the function of the load includes the adaption circuit being configured to selectively provide a first additional charging current configured to charge the output node to the predefined output voltage if the load is a first load or provide a second additional charging current configured to charge the output node to the predefined output voltage if the load is a second load, wherein the first additional charging current is different from the second additional charging current, wherein the second load is different from the first load.

Example 3 is the adaptive voltage regulator of example 2, wherein the adaptation circuit is configured to receive a control signal indicating whether the first load or the second load is coupled to the output node as the load and wherein the adaptation circuit is configured to adapt the charging characteristic associated with the charging of the output node to the predefined output voltage based on the control signal.

Example 4 is the adaptive voltage regulator circuit of any one of examples 1 to 3, wherein the voltage regulator circuit is configured to compare an actual voltage value of the regulated output voltage with a reference voltage value by a feedback loop and to regulate the actual voltage value to be substantially equal to the predefined output voltage, wherein the predefined output voltage is based on the reference voltage value.

Example 5 is the adaptive voltage regulator circuit of any one of examples 1 to 4, wherein the voltage regulator circuit includes a first subcircuit configured to generate a primary regulated output voltage based on a reference voltage provided to the voltage regulator circuit and a second subcircuit configured to provide the regulated output voltage to the output node as a duplicate voltage of the primary regulated output voltage.

Example 6 is the adaptive voltage regulator circuit of example 5, wherein the first subcircuit includes a regulator branch having a field-effect transistor in a source follower configuration, wherein the field-effect transistor is configured to provide the primary regulated output voltage.

Example 7 is the adaptive voltage regulator circuit of either of examples 5 or 6, wherein the second subcircuit comprises a duplicate branch having a field-effect transistor in a source follower configuration to provide the regulated output voltage to the output node as a duplicate voltage of the primary regulated output voltage.

Example 8 is the adaptive voltage regulator circuit of any one of examples 1 to 7, wherein the adaptation circuit includes one or more adaption branches, each of the one or more adaption branches including a series connection of a field-effect transistor in a source follower configuration and a controllable switch, wherein a switching of the controllable switch is configured to adapt the charging characteristic associated with the charging of the output node to the predefined output voltage as a function of the load.

Example 9 is the adaptive voltage regulator circuit of a combination of examples 6 and 7, wherein the one or more adaption branches and the regulator branch are in a parallel configuration between a supply node providing a supply voltage and a base node providing a base voltage.

Example 10 is the adaptive voltage regulator circuit of a combination of examples 7 and 8, wherein the one or more adaption branches and the duplicate branch are in a parallel configuration between a supply node providing a supply voltage and a base node providing a base voltage.

Example 11 is the adaptive voltage regulator circuit of a combination of examples 6, 7, and 8, wherein the one or more adaption branches, the regulator branch, and the duplicate branch are in a parallel configuration between a supply node providing a supply voltage and a base node providing a base voltage.

Example 12 is the adaptive voltage regulator circuit of any one of examples 3 to 11, further including a pulse generation circuit configured to generate one or more pulses as the control signal, and further including a trimming circuit configured to adjust a duration of each of the one or more pulses.

Example 13 is the adaptive voltage regulator circuit of example 12, wherein the trimming circuit comprises a plurality of switchable delay circuits, wherein each delay circuit is configured to provide, based on a trim enablement signal, an incremental delay to the trimming circuit.

Example 14 is the adaptive voltage regulator circuit of example 13, wherein each delay circuit comprises a switch in series with a capacitor, wherein the trim enablement signal is configured to enable or disable the switch, wherein when the switch is enabled, the capacitor is connected to the trimming circuit and when the switch is disabled, the capacitor is disconnected from the trimming circuit.

Example 15 is the adaptive voltage regulator circuit of example 14, wherein the control signal is based on an address trigger signal configured to indicate a change in the load.

Example 16 is the adaptive voltage regulator circuit of any one of examples 2 to 15, wherein the load comprises a memory array, wherein the first load comprises a first memory cell located at a first address of the memory array, wherein the second load comprises a second memory cell located at a second address of the memory array, wherein the first address is different from the second address.

Example 17 is a method for voltage regulation a method for voltage regulation that includes the features and/or structures of any of examples 1 to 16.

Example 18 is a method for voltage regulation, where the method includes providing a regulated output voltage at an output node of an adaptive voltage regulator circuit and adapting a charging characteristic associated with a charging of the output node to a predefined output voltage as a function of a load coupled to the output node.

Example 19 is the method of example 18, wherein adapting the charging characteristic includes providing a first additional charging current if the load is a first load. The method also includes providing a second additional charging current if the load is a second load, wherein the first additional charging current is different from the second additional charging current, and wherein the second load is different from the first load.

Example 20 is the method of example 19, wherein the method further includes receiving a control signal indicating whether the first load or the second load is coupled to the output node as the load. The method also includes adapting the charging characteristic based on the control signal.

Example 21 is the method of any one of examples 18 to 20, where method further includes comparing an actual voltage value of the regulated output voltage with a reference voltage value by a feedback loop. The method also includes regulating the actual voltage value to be substantially equal to the predefined output voltage, wherein the predefined output voltage is based on the reference voltage value.

Example 22 is the method of any one of examples 18 to 21, where method further includes generating a primary regulated output voltage based on a reference voltage. The method also includes providing the regulated output voltage to the output node as a duplicate voltage of the primary regulated output voltage.

Example 23 is the method of any one of examples 18 to 22, where the receiving the control signal includes generating one or more generated pulses. The method further includes adjusting a duration of each of the one or more pulses Example 24 is the method of example 23, where the method further includes providing, based on a trim enablement signal, an incremental delay to the trimming circuit.

Example 25 is a method of any of examples 18 to 24 that includes the features and/or structures of any of examples 1 to 16.

Example 26 is a method for providing a regulated output voltage to a control line of a memory circuit, where the method includes receiving an indication of a load change associated with the control line of the memory circuit. The method also includes adding a boost current to the control line based on the load change.

Example 27 is the method of example 26, wherein the control line is a word-line of the memory circuit.

Example 28 is the method of any one of examples 26 to 27, wherein adding the boost current to the control line includes switching in one or more current-sourcing circuits that each provide an additional supply of current to the control line.

Example 29 is the method of any one of examples 26 to 28 that includes the features and/or structures of any of examples 1 to 16.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

According to various aspects, voltage regulator described herein may allow for keeping a variation of read voltages in a memory device that includes a plurality of memory cells within, for example, +/−50 mV across various switching scenarios of read addresses.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. An adaptive voltage regulator circuit comprising:
a voltage regulator circuit configured to provide a regulated output voltage at an output node of the adaptive voltage regulator circuit;
a pulse generation circuit configured to generate one or more pulses as a control signal, wherein the control signal indicates whether a first load or a second load that is different from the first load is coupled to the output node; and
an adaptation circuit coupled to the output node and configured to adapt based on the control signal a charging characteristic associated with a charging of the output node to a predefined output voltage.

2. The adaptive voltage regulator circuit of claim 1, wherein the adaption circuit configured to adapt the charging characteristic associated with the charging of the output node to the predefined output voltage as a function of whether the first load or the second load is coupled to the output node comprises:
the adaption circuit configured to selectively provide a first additional charging current configured to charge the output node to the predefined output voltage if the control signal indicates the first load is coupled to the output node or provide a second additional charging current configured to charge the output node to the predefined output voltage if the control signal indicates the second load is coupled to the output node, wherein the first additional charging current is different from the second additional charging current.

3. The adaptive voltage regulator circuit of claim 2, wherein the first load comprises a first memory cell located at a first address of a memory array, wherein the second load comprises a second memory cell located at a second address of the memory array, wherein the first address is different from the second address.

4. The adaptive voltage regulator circuit of claim 1, wherein the voltage regulator circuit is configured to compare an actual voltage value of the regulated output voltage with a reference voltage value by a feedback loop and to regulate the actual voltage value to be substantially equal to the predefined output voltage, wherein the predefined output voltage is based on the reference voltage value.

5. The adaptive voltage regulator circuit of claim 1, wherein the voltage regulator circuit comprises a first subcircuit configured to generate a primary regulated output voltage based on a reference voltage provided to the voltage regulator circuit and a second subcircuit configured to provide the regulated output voltage to the output node as a duplicate voltage of the primary regulated output voltage.

6. The adaptive voltage regulator circuit of claim 5, wherein the first subcircuit comprises a regulator branch having a field-effect transistor in a source follower configuration, wherein the field-effect transistor is configured to provide the primary regulated output voltage.

7. The adaptive voltage regulator circuit of claim 5, wherein the second subcircuit comprises a duplicate branch having a field-effect transistor in a source follower configuration to provide the regulated output voltage to the output node as a duplicate voltage of the primary regulated output voltage.

8. The adaptive voltage regulator circuit of claim 1, wherein the adaptation circuit comprises one or more adaption branches, each of the one or more adaption branches comprising:
a series connection of a field-effect transistor in a source follower configuration and a controllable switch, wherein a switching of the controllable switch is configured to adapt the charging characteristic associated with the charging of the output node to the predefined output voltage as a function of whether the first load or the second load is coupled to the output node.

9. The adaptive voltage regulator circuit of claim 8, wherein the one or more adaption branches are in a parallel configuration between a supply node providing a supply voltage and a base node providing a base voltage.

10. The adaptive voltage regulator circuit of claim 8, wherein the voltage regulator circuit comprises a regulator branch configured to generate a primary regulated output voltage based on a reference voltage provided to the voltage regulator circuit and a duplicate branch configured to provide the regulated output voltage to the output node as a duplicate voltage of the primary regulated output voltage,
wherein the one or more adaption branches and the duplicate branch are in a parallel configuration between a supply node providing a supply voltage and a base node providing a base voltage.

11. The adaptive voltage regulator circuit of claim 8, wherein the voltage regulator circuit comprises a regulator branch configured to generate a primary regulated output voltage based on a reference voltage provided to the voltage regulator circuit and a duplicate branch configured to provide the regulated output voltage to the output node as a duplicate voltage of the primary regulated output voltage,
wherein the one or more adaption branches, the regulator branch, and the duplicate branch are in a parallel configuration between a supply node providing a supply voltage and a base node providing a base voltage.

12. The adaptive voltage regulator circuit of claim 1, further comprising a trimming circuit configured to adjust a duration of each of the one or more pulses.

13. The adaptive voltage regulator circuit of claim 12, wherein the trimming circuit comprises a plurality of switchable delay circuits, wherein each delay circuit is configured to provide, based on a trim enablement signal, an incremental delay to the trimming circuit.

14. The adaptive voltage regulator circuit of claim 13, wherein each delay circuit comprises a switch in series with a capacitor, wherein the trim enablement signal is configured to enable or disable the switch, wherein when the switch is enabled, the capacitor is connected to the trimming circuit and when the switch is disabled, the capacitor is disconnected from the trimming circuit.

15. The adaptive voltage regulator circuit of claim 1, wherein
the control signal is based on an address trigger signal configured to indicate a change in whether the first load or the second load is coupled to the output node.

16. A method for voltage regulation, the method comprising:
providing a regulated output voltage at an output node of an adaptive voltage regulator circuit to operate memory cells addressable in groups that are segmented according to a word, sector, and/or plane address; and
adapting a charging characteristic associated with a charging of the output node to a predefined output voltage, wherein the charging characteristic is adapted based on a difference between a current word, sector, and/or plane address of a currently addressed group of memory cells and a previous word, sector, and/or plane of a previously addressed group of memory cells.

17. The method of claim 16, wherein the current word, sector, and/or plane address of the currently addressed group of memory cells is indicative of a first load and the previous word, sector, and/or plane address of the previously addressed group of memory cells is indicative of a second load and the adapting the charging characteristic comprises:
providing a first additional charging current if the first load is coupled to the output node; and
providing a second additional charging current if the second load is coupled to the output node, wherein the first additional charging current is different from the second additional charging current, and wherein the second load is different from the first load.

18. The method of claim 17, the method further comprising:
receiving a control signal indicating whether the first load or the second load is coupled to the output node; and
adapting the charging characteristic based on the control signal.

19. A method for providing a regulated output voltage to a control line of a memory circuit, the method comprising:
receiving an indication of a load change associated with the control line of the memory circuit, wherein the receiving the indication of the load change comprises receiving one or more pulses as a control signal that indicates whether a first load or a second load that is different from the first load is coupled to the control line; and adding a boost current to the control line based on the control signal.

\* \* \* \* \*